(12) United States Patent
Chavez et al.

(10) Patent No.: US 9,797,225 B2
(45) Date of Patent: Oct. 24, 2017

(54) DATA COMPRESSION OF HYDROCARBON RESERVOIR SIMULATION GRIDS

(71) Applicants: Saudi Arabian Oil Company, Dhahran (SA); King Abdullah University of Science and Technology, Thuwal (SA)

(72) Inventors: Gustavo Ivan Chavez, Thuwal (SA); Badr M. Harbi, Dhahran (SA)

(73) Assignees: Saudi Arabian Oil Company, Dhahran (SA); King Abdullah University of Science and Technology, Thuwal (SA)

( * ) Notice: Subject to any disclaimer, the term of this patent is extended or adjusted under 35 U.S.C. 154(b) by 1002 days.

(21) Appl. No.: 14/091,588

(22) Filed: Nov. 27, 2013

(65) Prior Publication Data
US 2015/0149139 A1 May 28, 2015

(51) Int. Cl.
G06F 17/50 (2006.01)
E21B 43/00 (2006.01)
H03M 7/30 (2006.01)

(52) U.S. Cl.
CPC .......... *E21B 43/00* (2013.01); *G06F 17/5009* (2013.01); *H03M 7/3059* (2013.01); *H03M 7/70* (2013.01)

(58) Field of Classification Search
USPC .............................. 703/10, 2; 702/6; 345/420
See application file for complete search history.

(56) References Cited

U.S. PATENT DOCUMENTS 6,323,863 B1  11/2001  Shinagawa et al.
7,348,976 B2  3/2008  Mori
(Continued)

FOREIGN PATENT DOCUMENTS

WO    2006/109978 A1    10/2006
WO    2012000555 A1    1/2012
WO    2012/046239 A2    4/2012

OTHER PUBLICATIONS

International Search Report and Written Opinion for related PCT application PCT/US2014/065896 dated Feb. 19, 2015.
(Continued)

*Primary Examiner* — Thai Phan
(74) *Attorney, Agent, or Firm* — Bracewell LLP; Constance G. Rhebergen; Albert B. Kimball, Jr.

(57) ABSTRACT

A dense volumetric grid coming from an oil/gas reservoir simulation output is translated into a compact representation that supports desired features such as interactive visualization, geometric continuity, color mapping and quad representation. A set of four control curves per layer results from processing the grid data, and a complete set of these 3-dimensional surfaces represents the complete volume data and can map reservoir properties of interest to analysts. The processing results yield a representation of reservoir simulation results which has reduced data storage requirements and permits quick performance interaction between reservoir analysts and the simulation data. The degree of reservoir grid compression can be selected according to the quality required, by adjusting for different thresholds, such as approximation error and level of detail. The processions results are of potential benefit in applications such as interactive rendering, data compression, and in-situ visualization of large-scale oil/gas reservoir simulations.

15 Claims, 14 Drawing Sheets

(56) References Cited

U.S. PATENT DOCUMENTS

| | | | |
|---|---|---|---|
| 9,134,454 B2* | 9/2015 | Mishev | G06F 17/5018 |
| 2003/0023383 A1 | 1/2003 | Stark | |
| 2005/0089237 A1 | 4/2005 | Park et al. | |
| 2006/0136162 A1* | 6/2006 | Hamman | G01V 1/306 |
| | | | 702/104 |
| 2006/0265402 A1* | 11/2006 | Edmond | G06F 17/30017 |
| 2006/0265436 A1* | 11/2006 | Edmond | G06F 17/30017 |
| 2008/0266172 A1* | 10/2008 | Reinpoldt | G01S 7/22 |
| | | | 342/179 |
| 2009/0254575 A1 | 10/2009 | Kravets | |
| 2009/0263030 A1* | 10/2009 | Ramasastry | H04N 19/63 |
| | | | 382/232 |
| 2011/0015909 A1* | 1/2011 | Zhao | E21B 49/00 |
| | | | 703/2 |
| 2011/0313745 A1* | 12/2011 | Mezghani | G01V 99/00 |
| | | | 703/10 |
| 2012/0001915 A1 | 1/2012 | Peterson | |
| 2012/0143510 A1 | 6/2012 | Alam | |
| 2012/0320054 A1 | 12/2012 | Chavez et al. | |
| 2013/0035913 A1* | 2/2013 | Mishev | G06F 17/5018 |
| | | | 703/2 |
| 2013/0275106 A1* | 10/2013 | Li | G01V 11/00 |
| | | | 703/10 |
| 2015/0120255 A1* | 4/2015 | King | E21B 43/00 |
| | | | 703/2 |

OTHER PUBLICATIONS

Wikipedia, Sparse Matrix, Mar. 8, 2017, pp. 1-7.
Wikipedia, Sparse Matrix, Apr. 16, 2013, pp. 1-7.

\* cited by examiner

DATA COMPRESSION OF HYDROCARBON RESERVOIR SIMULATION GRIDS

BACKGROUND OF THE INVENTION

1. Field of the Invention

The present invention relates to reservoir simulation by computer processing and more particularly to processing data relating to a subsurface reservoir to compress the reservoir simulation grids, and subsequently to decompress the grids for study and analysis of the simulation results.

2. Description of the Related Art

In the oil and gas industries, massive amounts of data are required to be processed for computerized simulation, modeling, and analysis for exploration and production purposes. For example, the development of underground hydrocarbon reservoirs typically includes development and analysis of computer simulation models of the reservoir. A realistic simulation model of the reservoir, and the presence of its fluids, helps in forecasting the optimal future oil and gas recovery from hydrocarbon reservoirs. Oil and gas companies have come to depend on simulation models as an important tool to enhance the ability to exploit a petroleum reserve.

The underground hydrocarbon reservoirs are typically complex rock formations which contain both a petroleum fluid mixture and water. The reservoir fluid content usually exists in two or more fluid phases. The petroleum mixture in reservoir fluids is produced by wells drilled into and completed in these rock formations. Sometimes, fluids such as water and/or gases are also injected into these rock formations to improve the recovery of the petroleum fluids.

Reservoir simulation belongs to the general domain of flow in porous media simulation. However, reservoir simulation normally involves multiple hydrocarbon components and multiple fluid phases in an underground geological formation which is under high pressure and temperature. The chemical phase behavior of these hydrocarbon fluids and the included groundwater has to be taken into account in these simulators.

The simulation models contain volumetric data which describe the specific geometry of the rock formations and the wells, and also reservoir properties data, such as the fluid and rock properties, as well as production and injection history pertaining to the specific reservoirs of the oil or gas field in question. The simulation models are formed by a simulator (known as a reservoir simulator) which is a suite of computer programs run on a data processing system.

The reservoir simulator which runs these models is a computer implemented numerical methodology, or coded algorithms and data constructs of an underlying mathematical model. The mathematical model which represents the physics of fluid movements in these hydrocarbon reservoirs is a system of nonlinear partial differential equations which describe the transient multiple-phase, multiple-component fluid flow, and material balance behaviors in these reservoirs induced by the production and/or injection of fluids, as well as the pressure-volume-temperature (PVT) relationships of the reservoir fluids.

A reservoir simulator simulates the multiphase multicomponent fluid flow and material balance in subterranean reservoirs and the included surrounding porous rock formations by subdividing the volume into contiguous cells, also known as grid blocks. In simulation models, the reservoir is thus organized into a number of individual cells. A cell or grid block is the basic finite volume where the underlying mathematical model is applied. The number of cells varies depends on the resolution needed for the simulation and the size of the reservoirs in question.

For a large reservoir, such as the type known in the industry as a giant reservoir, which may have multi-billion barrels of original oil-in-place (OOIP), the number of grid cells can be in the hundreds of millions to over a billion. This number of cells is required in order to have adequate resolution to represent flow dynamics, formation rock porosity and permeability heterogeneity, and many other geologic and depositional complexities within the reservoir. Simulation of this size reservoir can be termed giga-cell reservoir simulation.

The challenges in hydrocarbon reservoir simulation require the use of the latest technology to maximize recovery in a cost-effective manner. Reservoir simulators such as GigaPOWERS have been described in the literature. See, for example articles by Dogru, A. H. et al., "*A Next-Generation Parallel Reservoir Simulator for Giant Reservoirs,*" SPE 119272, proceedings of the 2009 SPE Reservoir Simulation Symposium, The Woodlands, Tex., USA, Feb. 2-4, 2009 and by Dogru, A. H., Fung, L. S., Middya, U., Al-Shaalan, T. M., Byer, T., Hoy, H., Hahn, W. A., Al-Zamel, N., Pita, J., Hemanthkumar, K., Mezghani, M., Al-Mana, A., Tan, J, Dreiman, T., Fugl, A, Al-Baiz, A., "*New Frontiers in Large Scale Reservoir Simulation,*" SPE 142297, Proceedings of the 2011 SPE Reservoir Simulation Symposium, The Woodlands, Tex., USA, Feb. 21-23, 2011. GigaPOWERS reservoir simulation is capable of fine-scale grid simulation that exceeds a billion-cell barrier for post-processing while utilizing hundreds of GB footprint per scenario.

The total number of simulation runs for a company with a number of hydrocarbon reservoirs and appreciable reserves exceeds multiple tens of thousands per year, and one or more petabytes of high performance storage is required to host these data. For full simulation studies, it is required to maintain and store for subsequent use and analysis all of the simulation visualization data that are represented by the hundreds or thousands gigabytes of reservoir simulations.

Consider the case of a single volumetric grid of $1024^3$ grid points (on the order of a billion cells) that is processed by a solver such as GigaPowers. Storing volumetric data alone requires 3 times $1024^3$ floats (4 bytes each) for space coordinates (x, y, z). State of the art data formats would imply a memory space or capacity of 12.88 GB for volumetric data alone.

This memory space for volumetric data coordinates is required without even considering the many other properties attached to each cell as a result of simulation, such as oil saturation, water saturation, etc. Serious maintenance issues arise due to the vast file size, such as time delays for I/O, file disk size limitations, and required support for increasing or expanding the available memory space capacity as petroleum engineers and reservoir analysts generate more simulation data on a continuing basis.

SUMMARY OF THE INVENTION

Briefly, the present invention provides a new and improved computer implemented method of compressing reservoir simulation data representative of a subterranean reservoir organized into a three dimensional grid of reservoir cells arranged in a set of layers in a vertical dimension of the three dimensional grid. The computer implemented method according to the present invention selects a layer from the three dimensional grid, and batch compresses the reservoir simulation grid data to a compressed layer file representation. The compressed layer file representation is stored in memory. The steps of selecting, batch compressing and storing are repeated for the set of layers of the three dimensional grid; and a reduced representation is formed of the reservoir from the stored compressed layer file representations of the layers of the three dimensional grid for analysis.

The present invention also provides a new and improved data processing system for compressing reservoir simulation data representative of a subterranean reservoir organized into a three dimensional grid of reservoir cells arranged in a set of layers in a vertical dimension of the three dimensional grid. The data processing system includes a processor which selects a layer from the three dimensional grid; and batch compresses the reservoir simulation grid data to a compressed layer file representation. The data processing system also includes memory which storing the compressed layer file representation. The processor further repeats the steps of selecting, batch compressing and storing for the set of layers of the three dimensional grid. An interface of the data processing system forms a reduced representation of the reservoir from the stored compressed layer file representations of the layers of the three dimensional grid for analysis.

The present invention further provides a new and improved data storage device having stored in a non-transitory computer readable medium computer operable instructions for causing a data processing system to compress reservoir simulation data representative of a subterranean reservoir organized into a three dimensional grid of reservoir cells arranged in a set of layers in a vertical dimension of the three dimensional grid. The instructions stored in the data storage device cause the data processing system to select a layer from the three dimensional grid, and batch compress the reservoir simulation grid data to a compressed layer file representation. The instructions also cause the data processing system to store in memory the compressed layer file representation, and to repeat the steps of selecting, batch compressing and storing for the set of layers of the three dimensional grid. The instructions also cause the data processing system to form a reduced representation of the reservoir from the stored compressed layer file representations of the layers of the three dimensional grid for analysis.

DETAILED DESCRIPTION OF THE PREFERRED EMBODIMENTS

Figure 1:
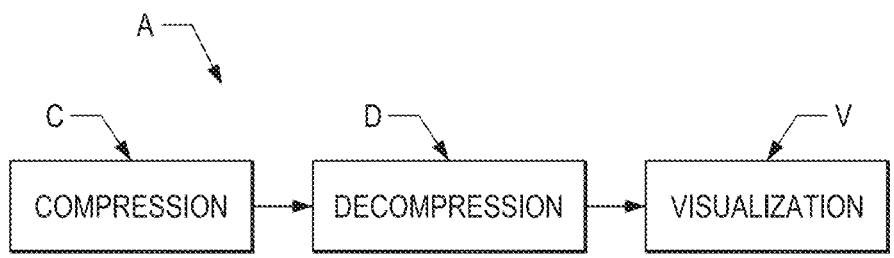
FIG. 1 is a schematic diagram of the organization of the processing methodology according to the present invention.

In the drawings, FIG. 1 illustrates schematically as indicated at A the organization of the computerized processing methodology for data compression of hydrocarbon reservoir simulation grids in accordance with the present invention. The processing is composed of three segments or parts as shown generally in FIG. 1.

As indicated at C, reservoir simulation grid data is subjected to a compression sequence. Batch compression is performed during segment or stage C, as will be set forth, and compresses reservoir simulation grid data from spatial xyz coordinates of the reservoir to mathematical coefficients. The compression methodology during stage C reads layer by layer a volumetric unstructured grid and computes coefficients layer by layer. The coefficients so obtained represent a main compressed grid file. The grid file is stored in computer memory and can be shared quickly given its relatively small size (in comparison to the original grid file size). The operational sequence of the compression processing C is set forth in FIG. 2, with the batch compression methodology processing B illustrated schematically in FIG. 4.

As indicated at stage or segment D in FIG. 1, the stored compressed grid data is available to be subjected to decompression processing. Processing during decompression stage D opens the main compressed grid file and extracts grid information to evaluate the basic functions and re-generate a surface of interest to a user reservoir analyst or engineer. The operational sequence of the decompression processing D is set forth in FIG. 6.

During stage or segment V, the decompressed grid data resulting from decompression processing in stage D is subject to visualization processing. Surfaces of interest selected after decompression from the stored compressed grid data are mapped to geometric primitives and displayed to the user at a specified display resolution, in interactive time. The operational sequence of the visualization processing V is set forth in FIG. 8.

Data Processing Methodology and System

Figure 3:
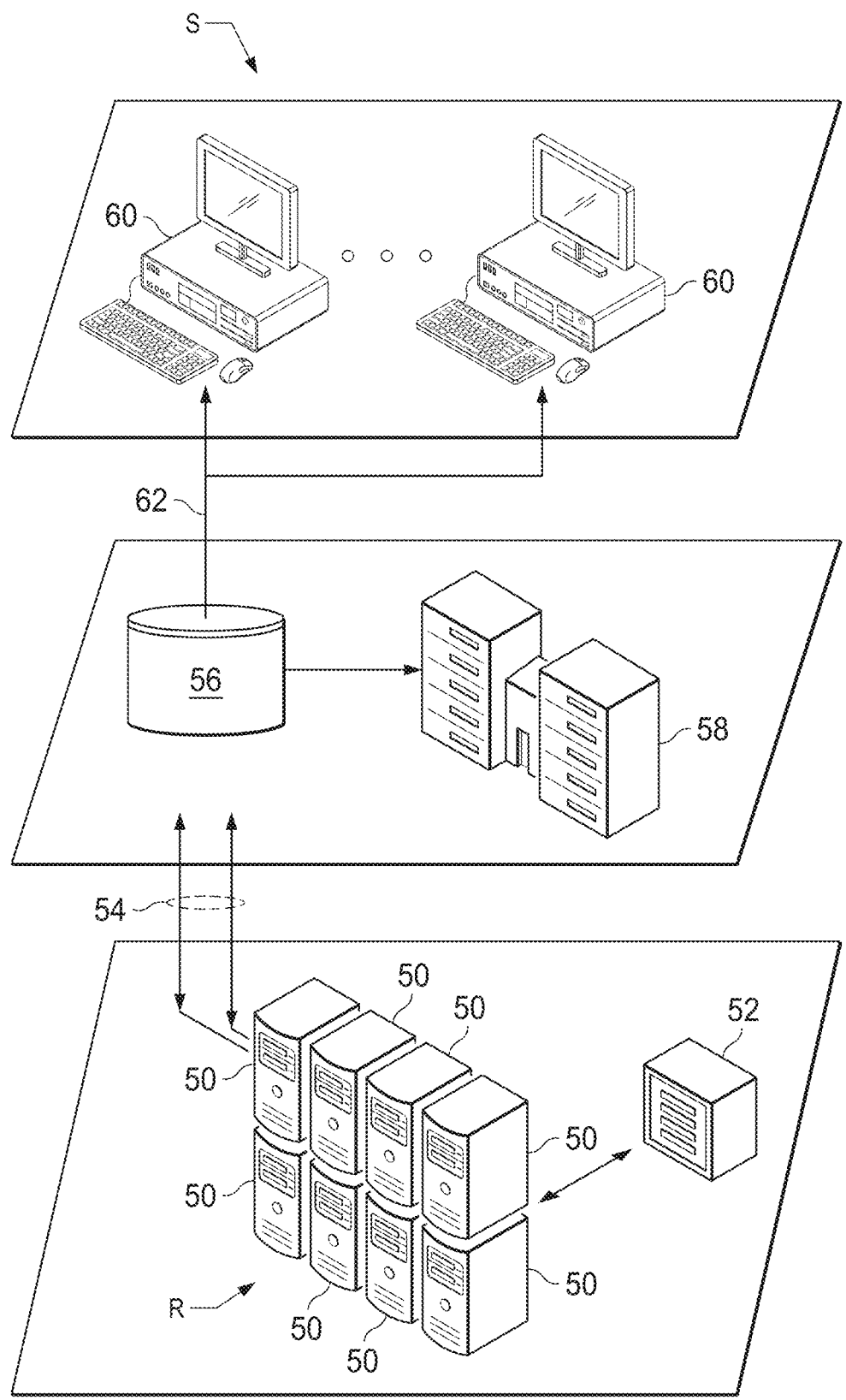
FIG. 3 is a schematic diagram of a computer network for data compression of hydrocarbon reservoir simulation grids according to the present invention.
Figure 4:
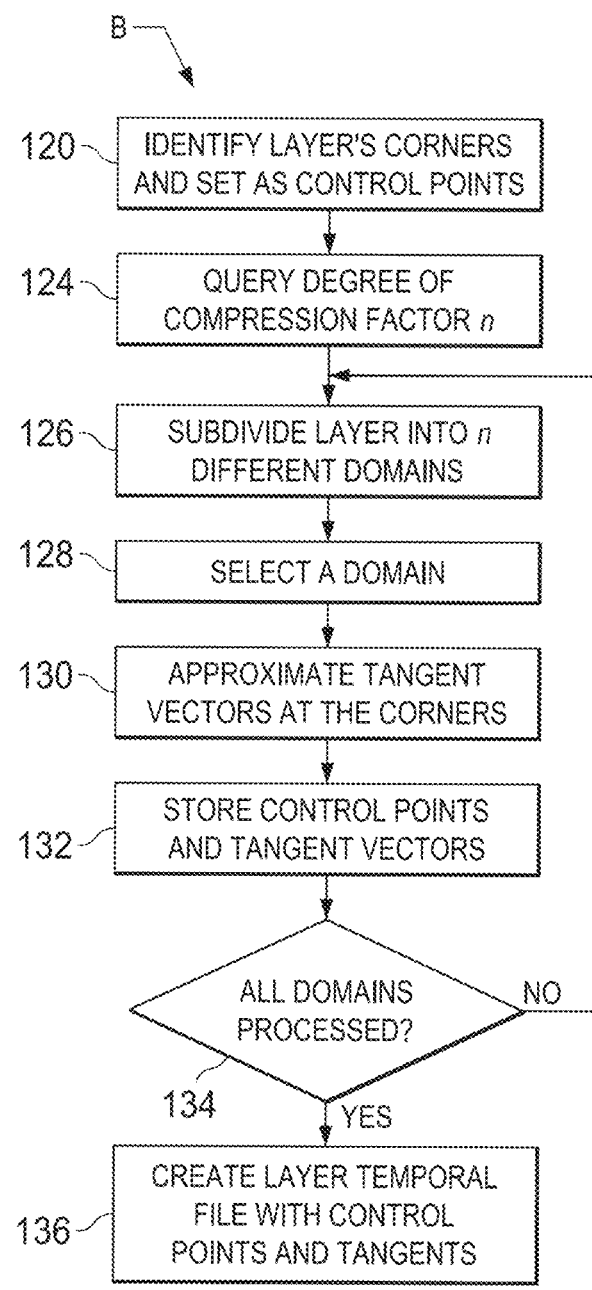
FIG. 4 is a functional block diagram of data processing steps for data compression for individual layers of hydrocarbon reservoir simulation grids according to FIG. 2.
Figure 5:
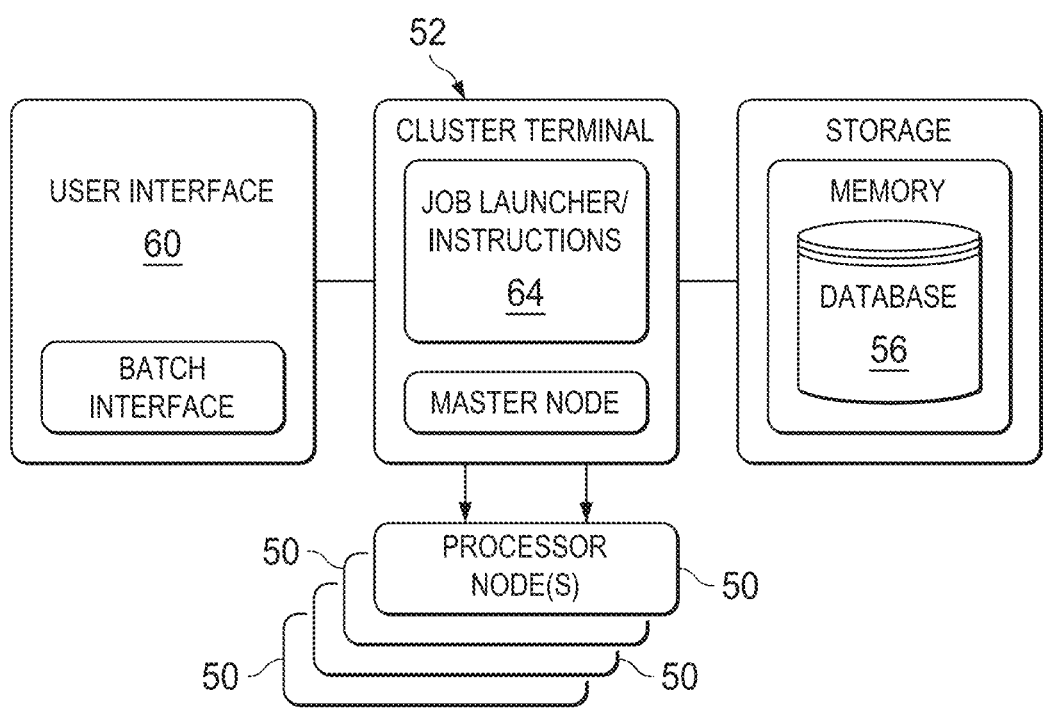
FIG. 5 is a schematic diagram of the computer network of FIG. 3 configured to perform the data processing steps of FIG. 4.
Figure 6:
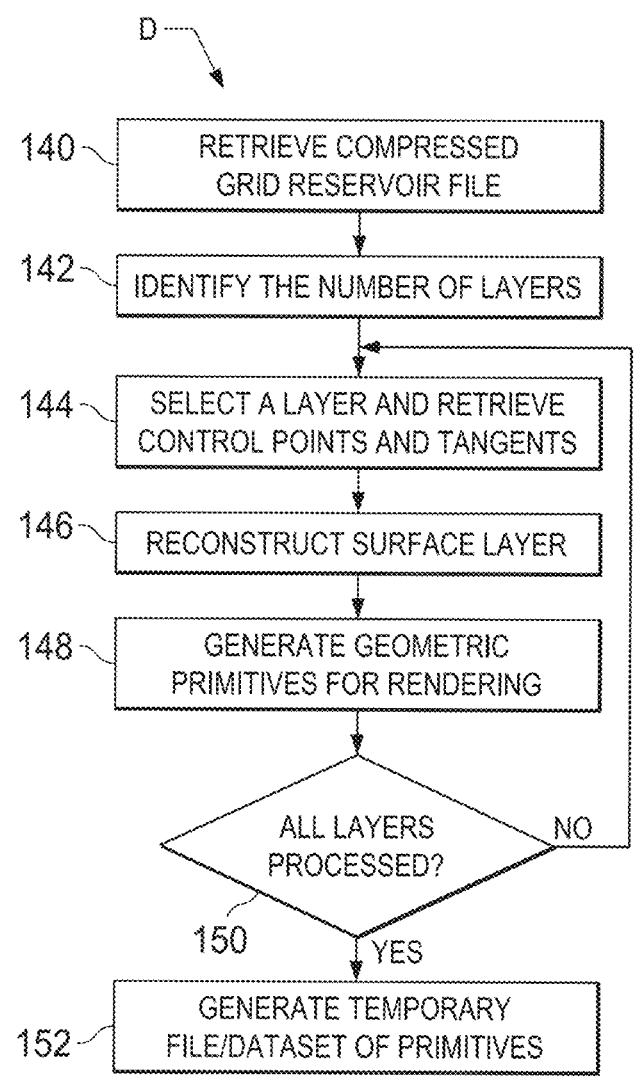
FIG. 6 is a functional block diagram of data processing steps for layer by layer data decompression of hydrocarbon reservoir simulation grids according to FIG. 1.
Figure 7:
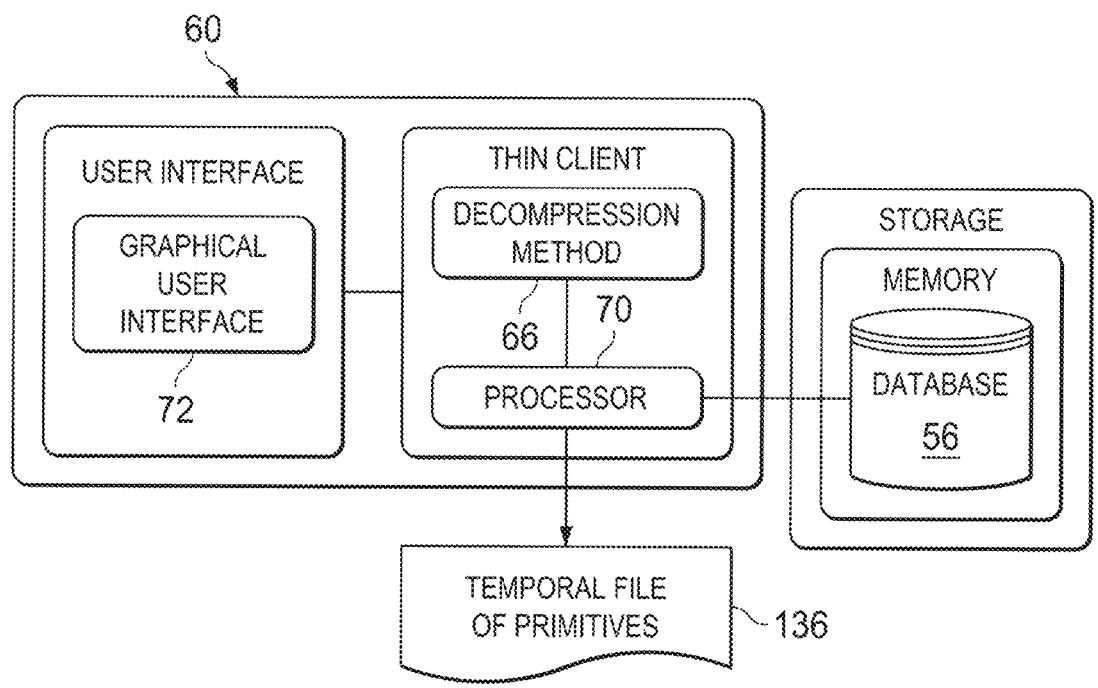
FIG. 7 is a schematic diagram of the computer network of FIG. 3 configured to perform the data processing steps of FIG. 2.
Figure 8:
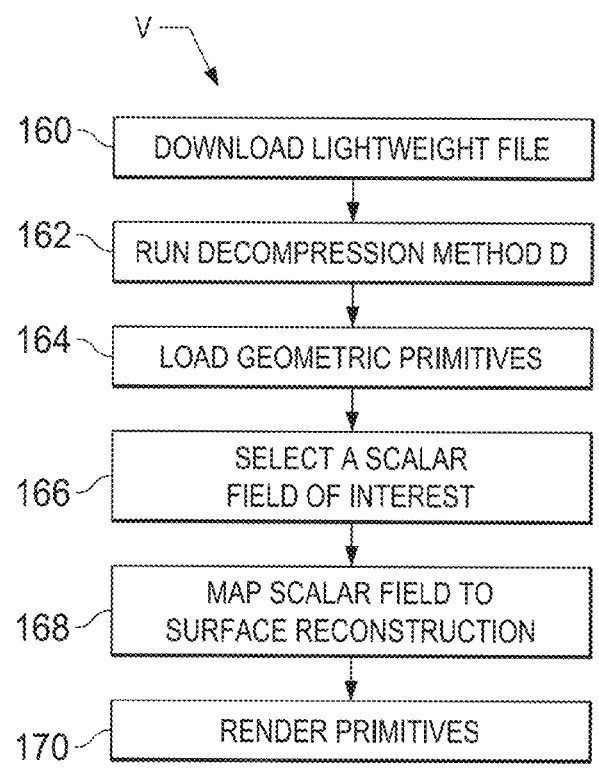
FIG. 8 is a functional block diagram of data processing steps for data visualization of hydrocarbon reservoir simulation grids according to FIG. 1.
Figure 9:
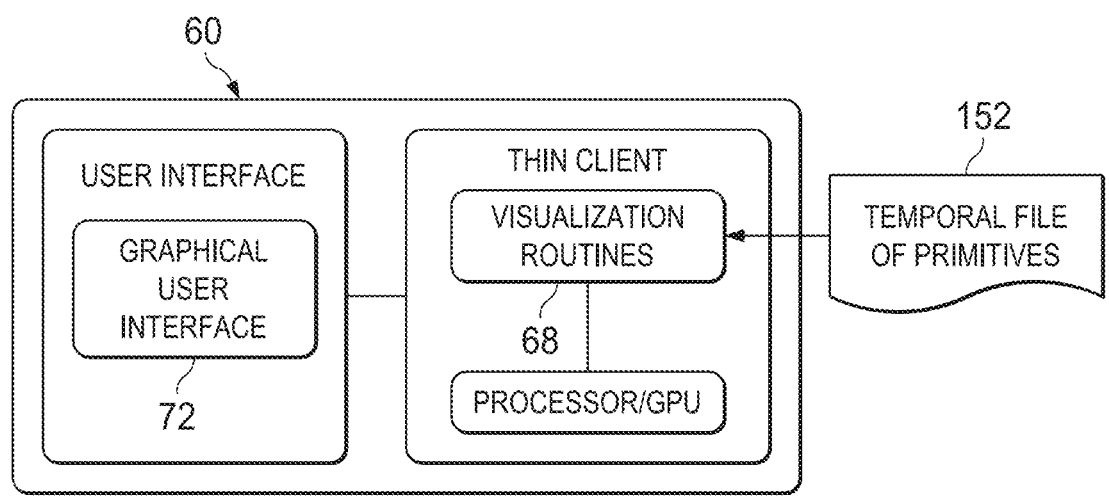
FIG. 9 is a schematic diagram of the computer network of FIG. 3 configured to perform the data processing steps of FIG. 8.

The computerized reservoir grid data processing of the present invention according to FIGS. 1, 2, 4, 6 and 8 is adapted for deployment on a variety of presently available high performance computing or HPC platforms. An example HPC environment for the present invention is a multi-node, multi-CPU, multi-core computer cluster system illustrated at R in a data processing system S of FIG. 3. More detailed schematic diagrams of the data processing system S showing components or units involved in the processing sequences of FIGS. 4, 6 and 8 are shown in FIGS. 5, 7 and 9, respectively.

The cluster R of the data processing system S (FIG. 3) is formed of a plurality of computer nodes indicated at 50 operating in parallel under control of one or more cluster terminals or router servers 52. The computer nodes 50 are provided with reservoir grid data in parallel as indicated by arrows 54 from disk storage 56 under control of cluster terminal server or servers 52. Original reservoir grid simulation input data is stored in a suitable number of data storage/file servers 56. The reservoir grid data in disk storage 56 is obtained from long term data storage memory 58 in the form of a suitable number of data storage memory units. The computer system S also includes a number of client work stations such as shown at 60 in FIG. 3 for user reservoir analysts and engineers. The work stations 60 are in data communication with reservoir grid data stored in disk storage 56 over a network, as indicated at 62.

The cluster terminal 52 operates during performance of the compression processing C under control of program code 64 (FIG. 5) stored in terminal 52. Similarly, the work station or stations 60 operate during performance of decompression processing D and visualization processing V under control of program code 66 and 68 (FIGS. 7 and 9) stored in each work station or stations. The program codes 64, 66 and 68 according to the present invention are in the form of non-transitory computer operable instructions causing associated terminal 52 or work station 60 to perform the respective reservoir grid data processing sequences, as will be described.

It should be noted that program codes 64, 66 and 68 may be in the form of microcode, programs, routines, or symbolic computer operable languages that provide a specific set of ordered operations that control the functioning of associated cluster terminal 52 or work station 60 of the data processing system S and direct its operation. The instructions of program codes 64, 66 and 68 may be stored in memory of the associated terminal or work station or on a data storage device such as computer diskette, magnetic tape, conventional hard disk drive, electronic read-only memory, optical storage device, or other appropriate data storage device having a non-transitory computer usable medium stored thereon.

Compression

Figure 2:
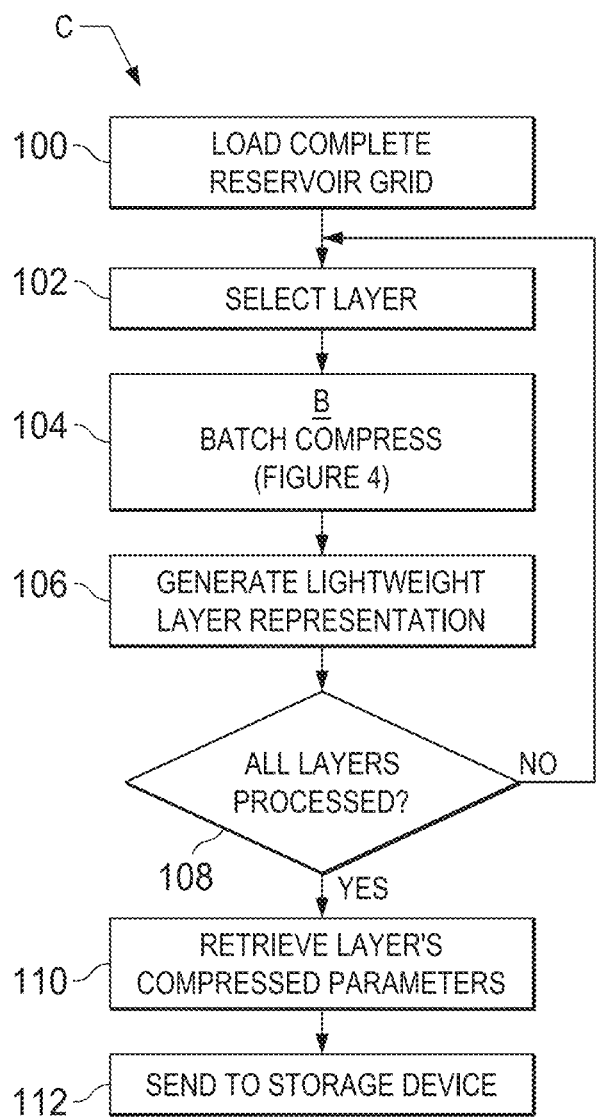
FIG. 2 is a functional block diagram of data processing steps for the processing methodology of data compression of hydrocarbon reservoir simulation grids according to the present invention.

With reference to FIG. 2, a high-level logic flowchart of a preferred sequence of steps for performing computer-implemented reservoir grid data compression processing C according to the present invention is illustrated schematically. As shown in FIG. 2, during step 100 of compression processing C the complete reservoir grid of interest is obtained from disk storage 56 after retrieval from long term data storage memory 58. A layer of interest is the reservoir grid is selected during step 102 for performance during step 104 of the batch compression processing B (FIG. 4) of the layer grid data by the computer cluster R.

During step 106, a lightweight or reduced data volume footprint representative of the compressed layer grid resulting from batch compression is formed. During step 108, a determination is made whether all layers of the reservoir grid of interest have been batch compressed. If not, processing returns to step 102 and another layer in the grid is select for batch compression.

If all layers of the grid of interest are indicated to have been processed during step 108, the layer's compressed parameters are retrieved during step 110 and the compressed parameters are sent during step 112 to storage disk 56.

The general process of compression implies a one by one transformation of each layer of a large volumetric grid coming from the discretization of an oil/gas reservoir. The final output is a lightweight file containing information about connectivity points and directions. This information in form of a file is then stored in a database on storage disk 56 of frequent access, or to long term storage 58, and is thereafter accessible to users at work stations 60 as reservoir information for use in day to day operations and for decision making.

The compression process is triggered in batch, possibly automatically right after simulation is over, launched by a user or client with access to a parallel cluster able to leverage the parallel nature of the processing. The processing is highly recursive in the sense that the same computational process is applied to equally divided regions of the layer of interest. A limit in the recursion process would be the size of the original grid, but for general visualization purposes and considering the highly adaptive basis, functions with only a few subdivisions are necessary to achieve a visually fair reconstruction.

Batch Compression

FIG. 4 illustrates a high-level logic flowchart sequence of steps for performing computer-implemented batch compression processing B during step 104 of compression processing C according to the present invention. As indicated at step 120, for a layer of interest selected during step 102, the corners of the layer are identified and set as control points.

Figure 10:
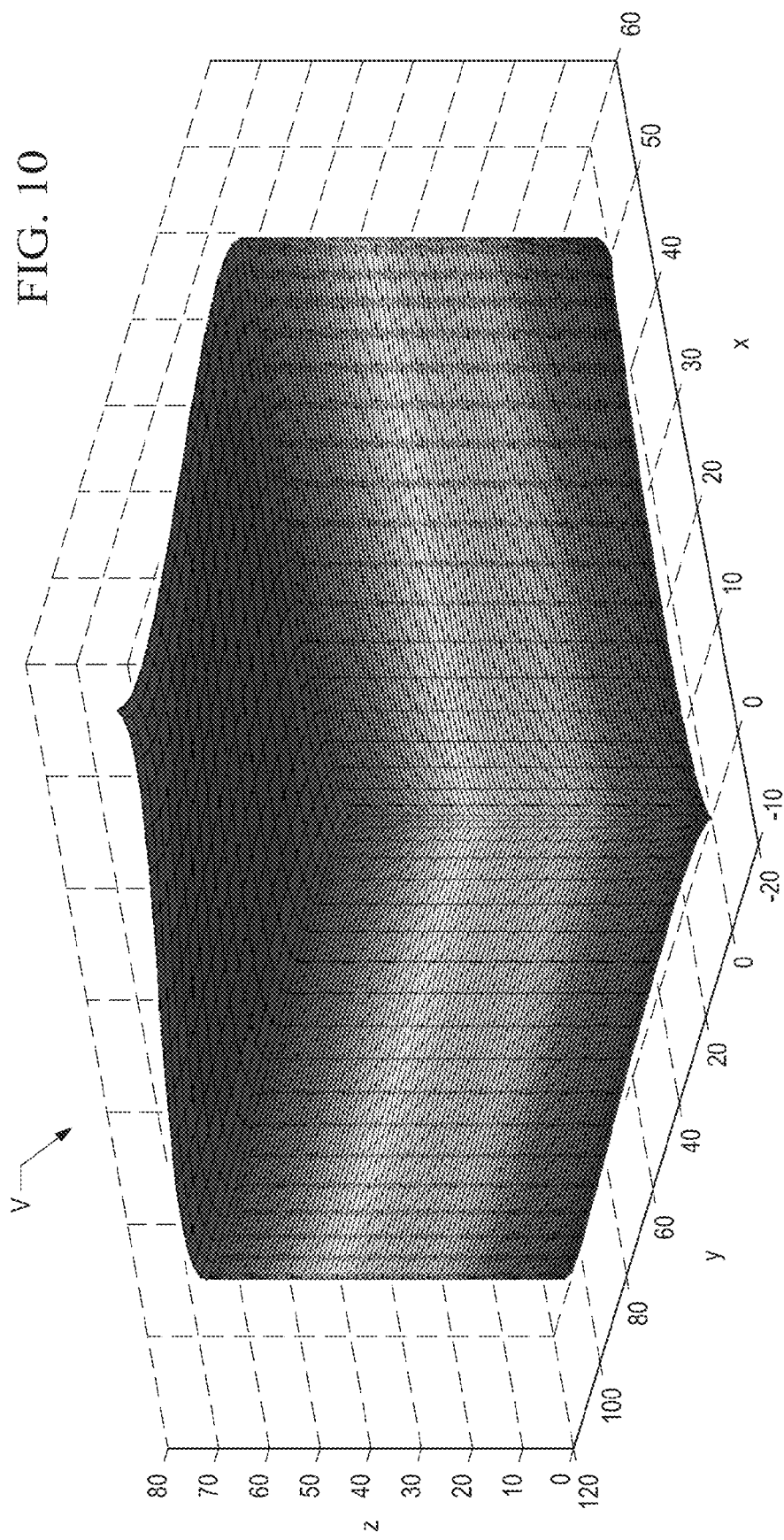
FIG. 10 is an example of a full display of a volume of reservoir simulation input data organized into a three dimensional grid of cells for processing according to the present invention.

As an example, a volume data set V of 49×104×69 cells (or about 25,000) reservoir grid cells is shown in shown in FIG. 10. The volume data set V is represented by 70 layers of 50×105 points. This means the other layers have similar shape and characteristics. The methodology of the present invention compresses the data layer by layer; therefore the first step is to decompose a single layer for compression.

Because of the small size of the image shown in FIG. 10 the seventy layers appear to be generally level or flat horizontal layers. However, an individual layer L shown in FIG. 11 is seen to be significantly arched from a high center portion to four lower corners.

Reservoirs are usually thin in the vertical axis or Z direction of the three dimensional coordinate system, compared to the areal size of the reservoirs. The 70 layers of FIG. 10 are assembled from actual real reservoir simulation data. The single layer L of FIG. 11 is scaled which is typical for reservoir visualization purposes. The layer L has a different scale on the Z axes than the stacked layers of FIG. 10 to emphasize the layer shape and results in the highly curved image of FIG. 11.

Figure 11:
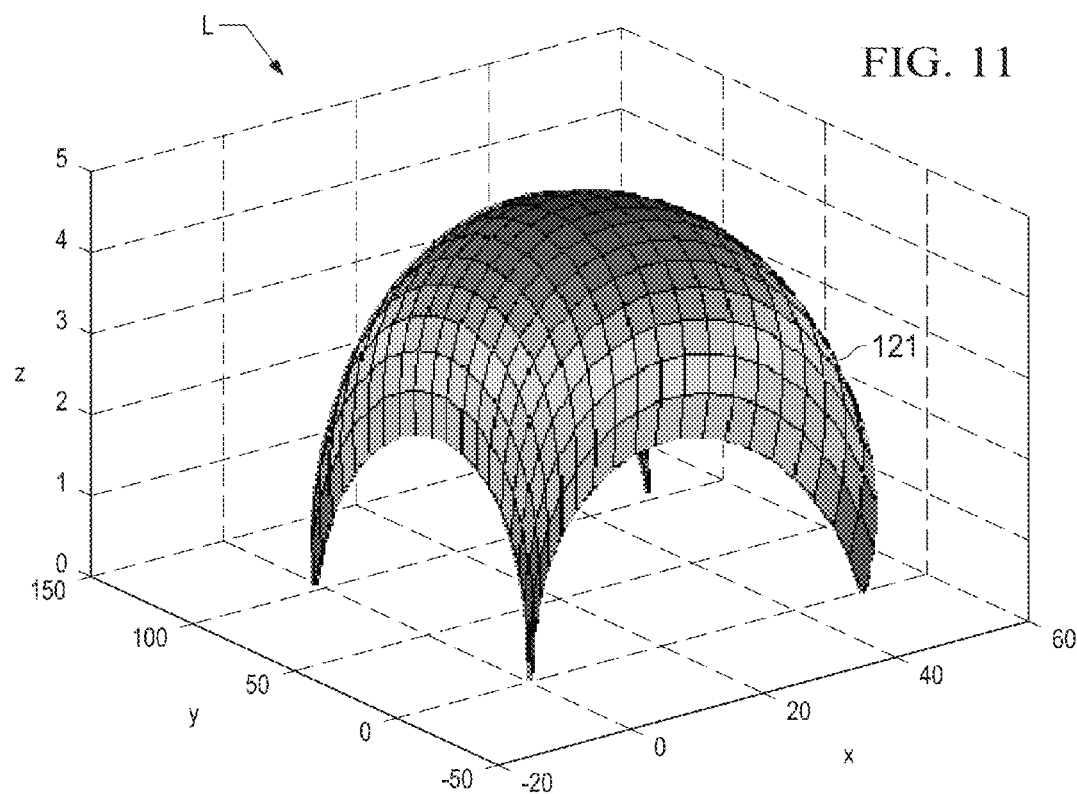
FIG. 11 is an example display of a single layer of the reservoir simulation input data of FIG. 10.
Figure 12:
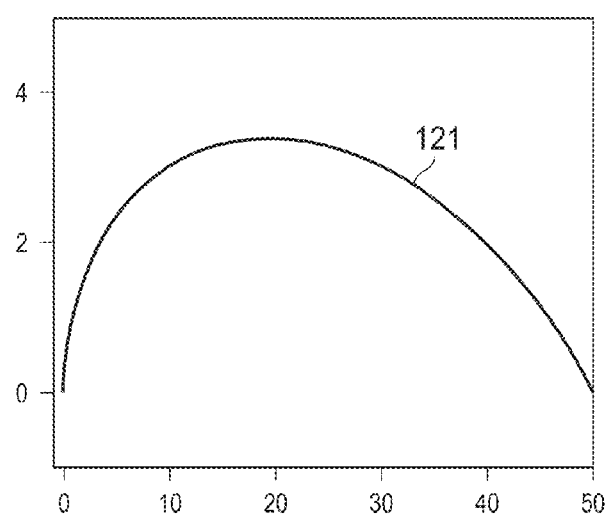
FIG. 12 is a graphical plot of a parametric cubic boundary curve representing an approximation of one side of the layer of FIG. 11.
Figure 13:
FIG. 13 is a graphical plot of the actual data of the side of the layer of FIG. 11 approximated in FIG. 12.
Figure 14:
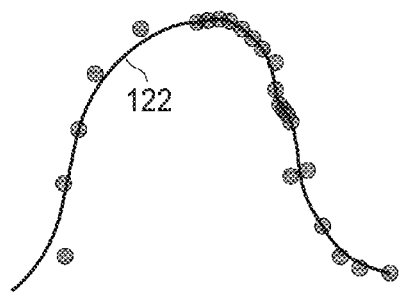
FIG. 14 is a plot of a smoothed boundary curve formed from data points of the data of FIG. 13.

Layer L in FIG. 11 can be seen to have four sides, each of which represents a two dimensional or 2-D surface, as shown in FIG. 12. Referring to a first side 121 of layer L, it can be seen to be composed of a set of boundary points (as shown schematically in FIG. 13) that can be approximated by an appropriately determined parametric cubic boundary curve 122, as shown in FIG. 14 in superposition with selected boundary points for the side 121 from the set of FIG. 13.

Figure 15:
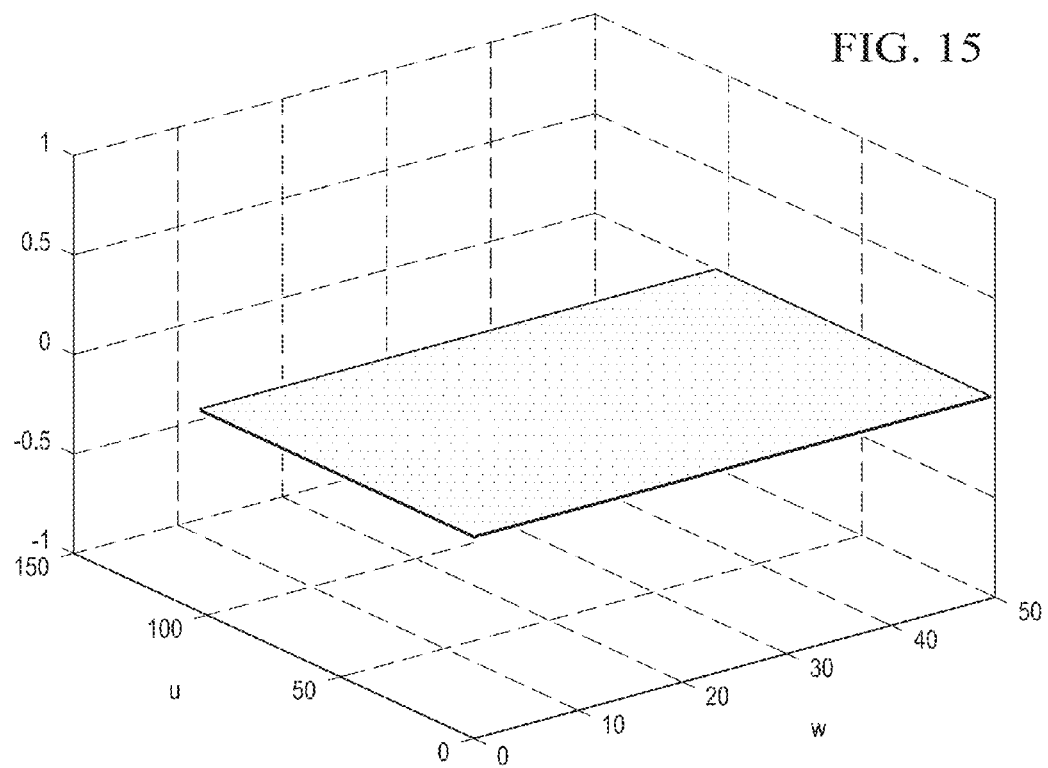
FIG. 15 is a representation of four sides of a reservoir layer plotted in parametric space.

For the purposes of the present invention, a mathematical representation in the form of a cubic Hermite spline function is utilized to represent the set of boundary points in compressed form. The spline function utilized can be defined with two points P and a tangent m per point. The result is a one dimensional or 1-D function in parameter space t, according to the following expression:

$$p(t) = (2t^3 + 3t^2 + 1)p_0 + (t^3 - 2t^2 + t)m_0 + (-2t^3 + 3t^2)p_1 + (t^3 - t^2)m_1$$

where $p_0$ and $p_1$ represent the two points P and $m_0$ and $m_1$ represent the two tangents. FIG. 15 is an illustration of each of the four sides of layer L in parametric space u and w.

During step 124 (FIG. 4), a determination of the degree of a compression factor n is made in response to a user query. For a layer side, a reduced representation is found. For example, a tolerance of 1.5 and Error=4 (units) results in 95.2% less data points. This represents a compression ratio of 20:1 per layer. With processing for the level 0 of compression, tangents are subsequently chosen for best fit (in a least square manner) to approximate the given data per layer. Additional levels of compression subdivide the layer to minimize the approximation error. Compression varies depending on topology, and thus each layer model may have a unique compression rate. Level zero of compression accounts for the 4 corner points and approximate tangents directions.

Level one of compression accounts for a subdivision by half in each horizontal direction (x-y plane) of the previous level. In the present example, this results in four new domains, as shown schematically in FIG. 16.

Figure 16:
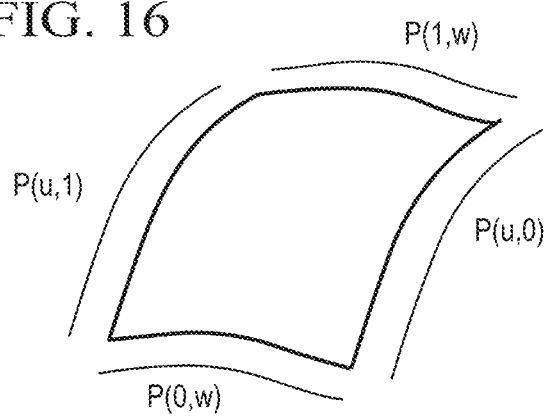
FIG. 16 is a plot of corresponding sides of the parameterization of FIG. 15.

The selected layer is divided during step 126 into a number of subdomains, as shown in FIG. 16, and during step 128 one of the domains of the layer being processed is selected. Sub-domains are computed separately according to the compression level selected and then retrieved in order for subsequent decompression (reconstruction) and visualization.

Computation of additional levels of compression can be done in parallel one subdomain per node of the cluster R of the data processing system S. The output of the compression computation is the spatial position of the joint or juncture of sub-surfaces and connectivity information for the subsurface, in order to merge the subsurface junctions together in decompression.

Using the formulation of the one dimensional expression for the problem now that each side can be represented by a mathematical function with fewer points than the whole set of points. This results in significant data storage requirement savings according to the present invention.

The formulation for a single layer side is extended to four parametric curves which describe the four boundaries which form a surface or layer L. The formulation is as follows:

$$Q(u, w) = P(u, 0)(1 - w) + P(u, 1)w + P(0, w)(1 - u) + P(1, w)u - P(0, 0)(1 - u)(1 - w) - P(0, 1)(1 - u)w - P(1, 0)u(1 - w) - P(1, 1)uw$$

Figure 17:
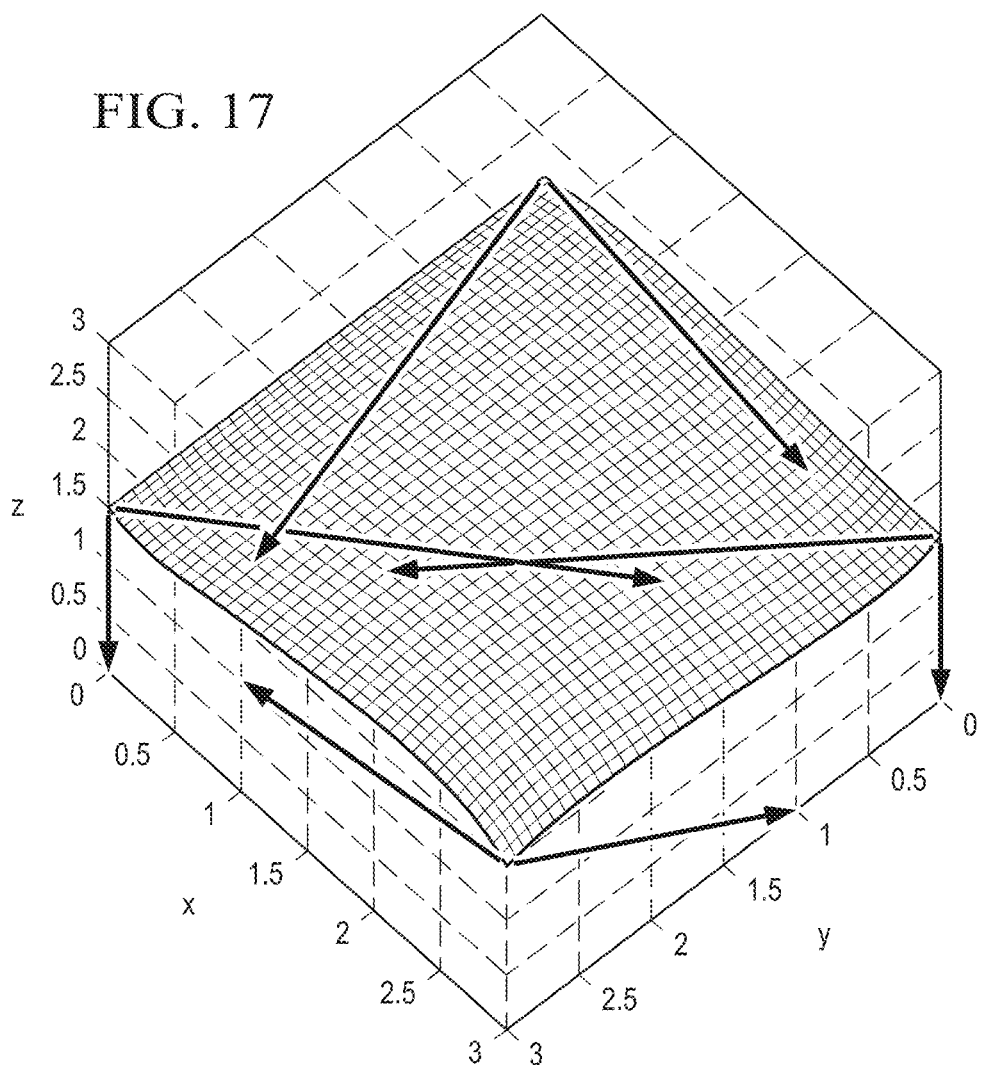
FIG. 17 is a plot of a four sided surface defined with corners and tangent vectors during processing according to the present invention.

A two dimensional or 2-D surface is thus defined that approximates the layer L based on four corners points and eight tangents with the formulation set forth above. FIG. 17 is a plot of the results obtained, from a four sided surface with four corners and eight tangent vectors, with level 0 of compression, one surface per layer. This is done by using what is known as a Coons patch, with 16 degrees of freedom. Coons' patches, for example, represent a general multi-sided surface definition that allows a curve formulation to be used for a composite surface. It should be understood that other forms of surface patches may be used, as well.

The curve formulation performed during step 122 is general enough to support any type of curve. A simpler form known as Ferguson patch may also be used, which has 12 degrees of freedom, namely 4 corners and 2 tangent vectors. Ferguson patches, for instance, make use of cubic polynomial curves.

Figure 18:
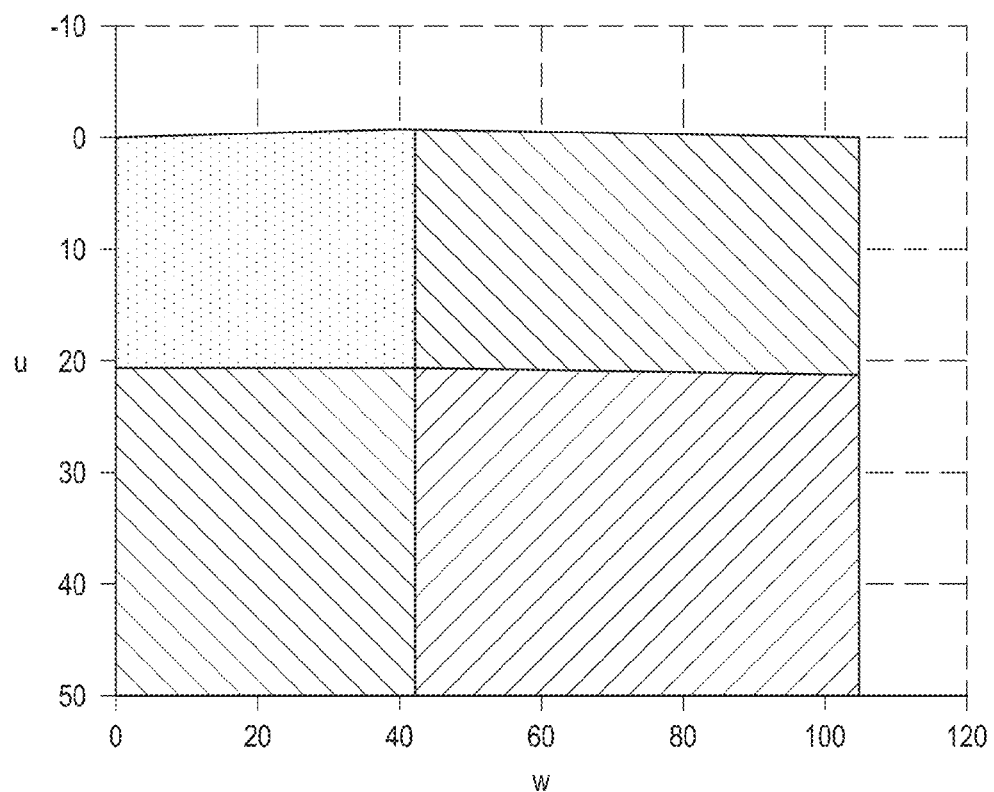
FIGS. 18, 19, 20 and 21 are example plots of different levels of compression and surfaces per layer according to the present invention.
Figure 19:
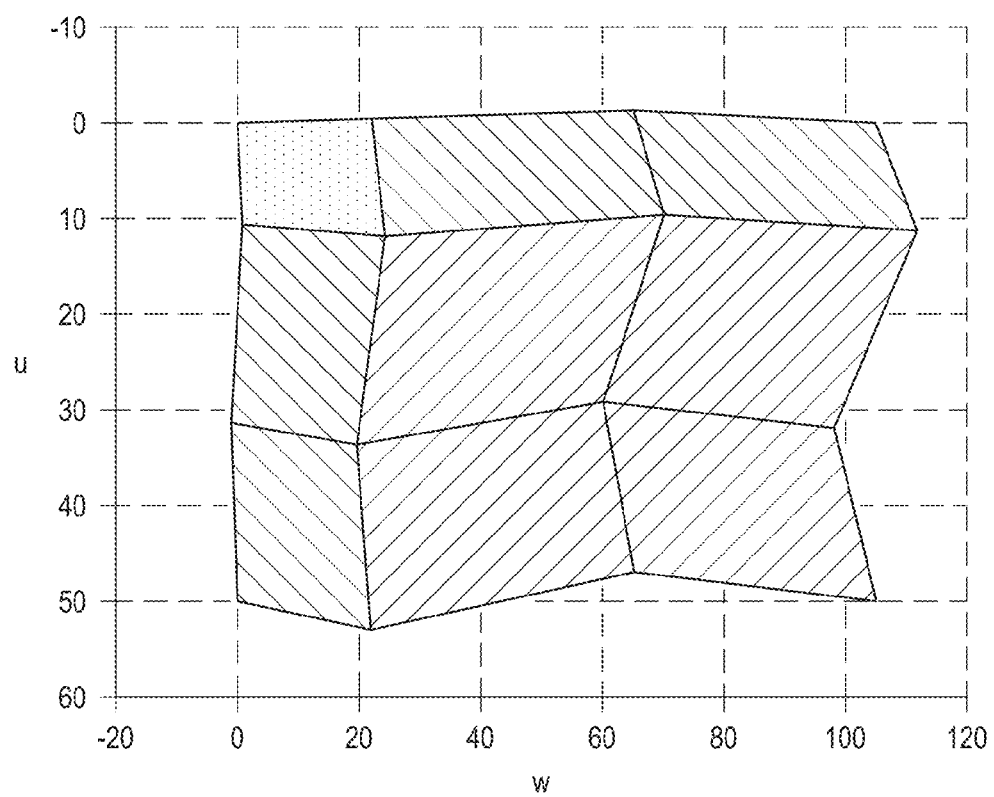
Figure 20:
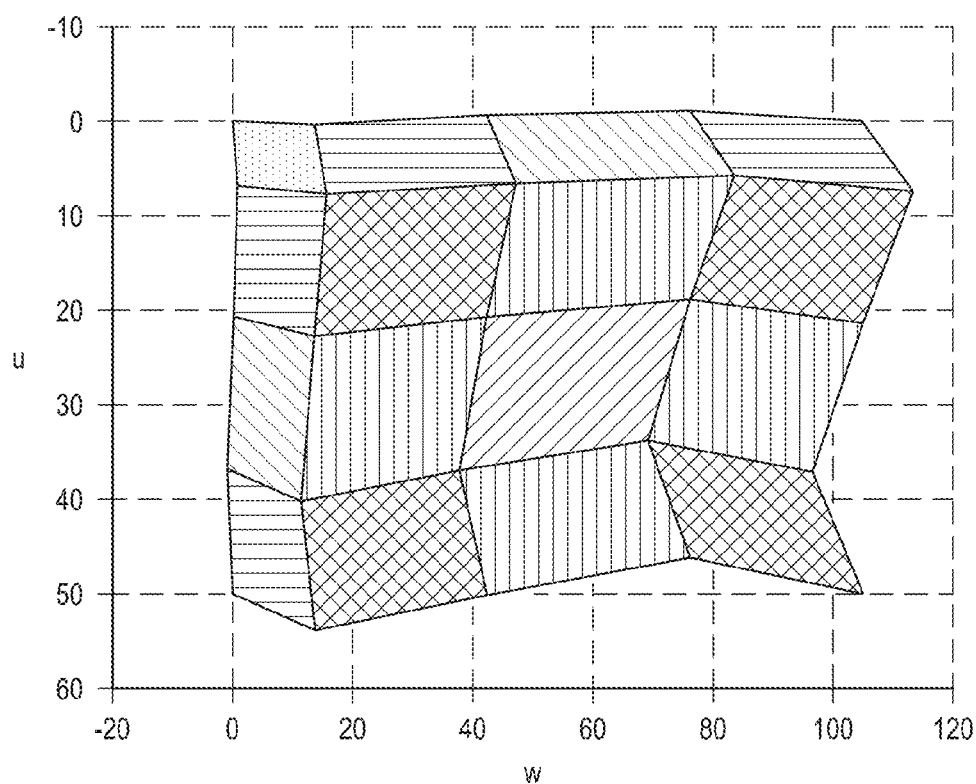
Figure 21:
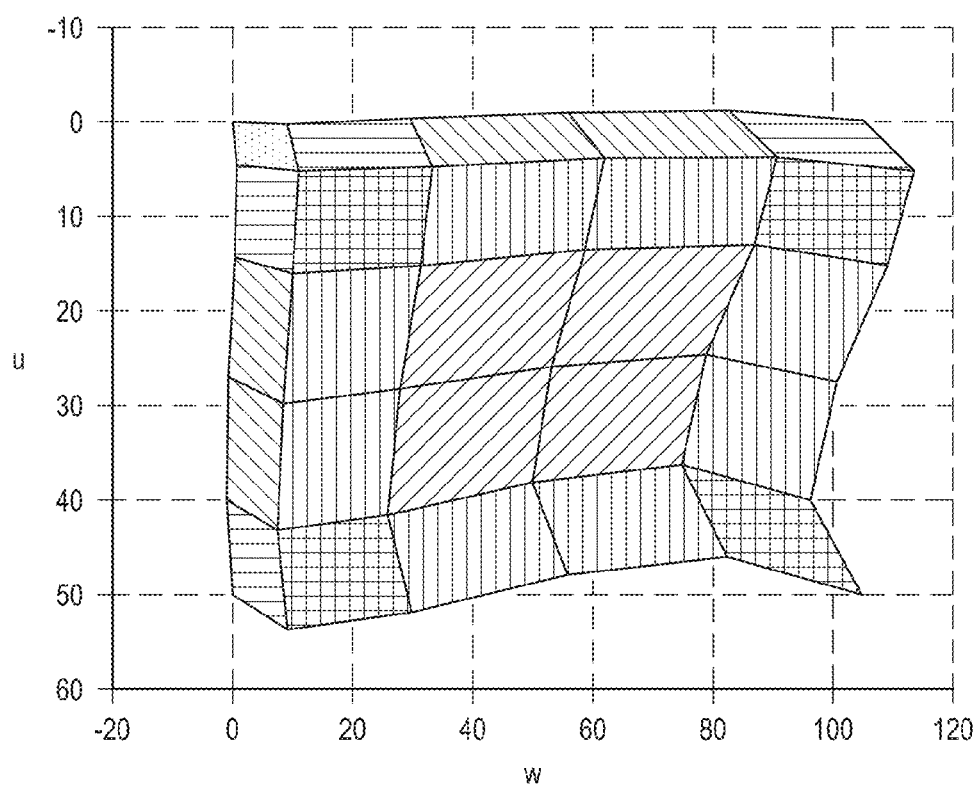

FIG. 18 shows schematically a level 1 of compression by equally subdividing a layer into four regions. FIGS. 19, 20 and 21 schematically represent subsequent levels of compression by further dividing the layers by increasing powers of two in order to provide final reconstruction. Different shading in sub regions denotes an independent subdomain of the underlying grid at a higher resolution than the previous subdivision level. During step 130, approximate tangent vectors at the corners of the layer being processed are selected. This is accomplished by assembling in the computer a suitable surface patch for the layer, based on the assembled sets of compressed data points for the four layer sides.

Figure 22:
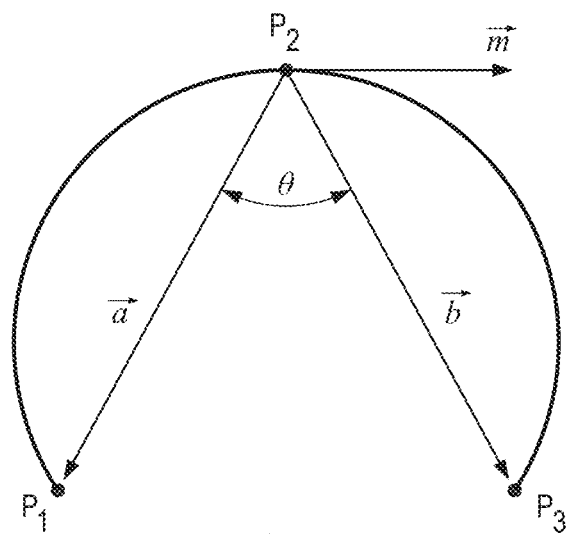
FIG. 22 is a schematic diagram illustrating the selection of boundary tangents during processing according to the present invention.

After visual and error requirements are met surfaces are joined together choosing boundary tangents so that continuity is preserved. Boundary tangents are selected or obtained by computer processing during step 130 as shown in FIG. 22. There are many conventional alternative techniques to approximate tangents across neighboring pieces of data. An example of one is the use of a general second order function such as a parabola to compute the slope of the middle point as shown in FIG. 22. It should be understood, as mentioned, that a number of conventional techniques to approximate tangents across neighboring pieces of data may be used for this purpose. The general second order function technique is illustrative.

A color mapping function is then applied during step 132 to the number of elements of the original data set properties (e.g. oil saturation, permeability, pressure, etc.) $A_1$ through $A_n$, with a new lower number $B_1$ through $B_m$ for the new cells according to the level of compression, as the schematic multivalued function diagram of FIG. 23 indicates.

Figure 23:
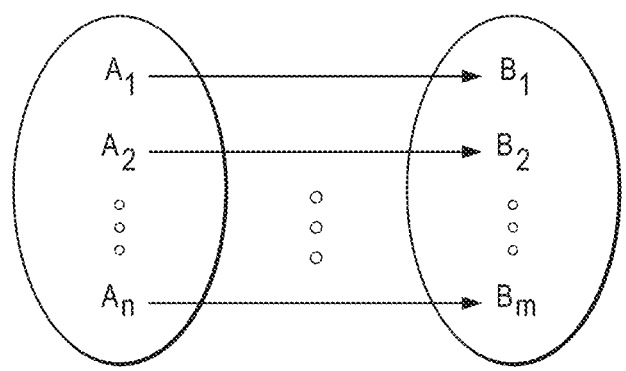
FIG. 23 is a schematic diagram of an example color mapping function applied during processing according to the present invention.

Color mapping of the type indicated in FIG. 23 is a conventional computer implemented functionality used to visualize a scalar of interest over an underlying grid. A description color mapping methodology and its implementation is presented, for example, at: http://en.wikipedia.org/wiki/Color_mapping.

During step 134, the control points and tangent vectors and the applied color mapping determined in the cluster R are stored in memory. During step 136, a determination is made whether all of the n domains of the identified layer have been batch compressed. If not, processing returns to step 126 and another domain is then processed according to steps 126, 128, 130 and 132 in the manner described above.

If all of the n domains of the identified layer are indicated to have been processed during step 134, a layer temporal file with control points and tangents is formed and stored during step 136 in memory.

Decompression

Decompression during the sequence or stage D is the middle step between retrieval and visualization; it opens up and reconstructs the underlying grid. The result is a set of geometric primitives in form of triangles or quadrangles that can be rendered in any modern graphics library such as OPENGL, DIRECTX, COIND3d, VTK, among others.

FIG. 6 illustrates a high-level logic flowchart of a preferred sequence of steps for performing computer-implemented decompression processing D of compression processing C according to the present invention. The decompression processing sequence D is performed in work station 60 under control of decompression operating instructions 66 stored in work station 60. As indicated at step 140, the compressed grid reservoir file of interest is retrieved by the work station 60 (FIG. 7) from storage disk 56.

In step 142, the number of layers in the reservoir grid is identified. During step 144, a layer is selected by a user and the control points and tangents resulting from step 136 of compression processing are retrieved. During step 146, the surface layer is reconstructed by processor 70 of the user work station 60, and during step 148, geometric primitives are generated for display or rendition on graphical user interface 72 of the work station 60.

During step 150, a determination is made whether all layers of the reservoir grid have completed decompression processing. If not, processing returns to step 144 and another layer is selected and then processed according to steps 146 and 148 in the manner described above. When each identified layer has been decompressed, a temporary file or dataset of geometric primitives is generated during step 152.

Visualization

Considering the visualization processing sequence V (FIG. 8), during step 160 a user selected compressed or lightweight file of interest in the reservoir is selected and downloaded to work station 60 from disk storage 52. The processing sequence V is performed by work station 60 under control of visualization routines operating instructions stored in work station 60. During step 162, the decompression processing sequence D shown in FIG. 6 is performed in the work station 60 under control of operating instructions 66 stored in memory of work station.

During step 164, the geometric primitives generated during step 152 (FIG. 6) are loaded into memory of work station 60 for processing. During step 166, a user selects a scalar field of interest in the reservoir. In step 168, the selected scalar field is mapped for surface reconstruction, and during step 170, the reservoir geometric primitives are rendered for display on graphical user interface 72 of the work station 60.

Rendering of the geometric primitives by graphical user interface 72 allows a client user to select the layer of interest to visualize and the scalar field of interest, e.g. oil saturation, water saturation, pressure, etc. With the present invention, it can thus be seen that due to the small size of the compressed grid file, the user client at the work station 60 is able to download and interact in real time with the grid.

A comparison of data storage reductions P with other well-known algorithms for mesh compression and certain standard computer graphics test models is provided and contrasted with current data in the chart below:

| Processing | Model | Gain |
|---|---|---|
| Compressing Polygon Mesh Connectivity with Degree Duality Prediction | triceratops cessna beethoven sandal shark al cupie tommygun cow teapot | 43.800% 10.500% 27.300% 18.700% 54.700% 17.000% 28.900% 13.500% 19.500% 32.500% |
| Binary Compression Rates for ASCII Formats | wolf raptor fish snake horse cat dog | 88.889% 88.889% 94.118% 92.308% 90.909% 87.500% 90.010% |
| Present Invention | Reservoir Layer | 95.010% |

The present invention forms a smooth representation of the reservoir of interest that preserves the data grid shape with significantly less data storage footprint requirements. The present invention thus has less storage memory requirements. Fewer I/O or input/output operations are required when a user is interacting with a compressed grid according to the present invention. The present invention allows faster data retrieval for visualization.

The present invention can thus be seen to provide an effective simulation grid methodology that reduces data footprint. The present invention has the potential to reduce the cost of new storage and retain generated scenarios after completion of simulation studies.

The invention has been sufficiently described so that a person with average knowledge in the field of reservoir modeling and simulation may reproduce and obtain the results mentioned in the invention herein. Nonetheless, any skilled person in the field of technique, subject of the invention herein, may carry out modifications not described in the request herein, to apply these modifications to a determined structure, or in the manufacturing process of the same, requires the claimed matter in the following claims; such structures shall be covered within the scope of the invention.

It should be noted and understood that there can be improvements and modifications made of the present invention described in detail above without departing from the spirit or scope of the invention as set forth in the accompanying claims.

What is claimed is:

1. A computer implemented method of compressing reservoir simulation data for reduced data storage requirements, the reservoir simulation data being representative of a subterranean reservoir organized into a three dimensional grid of reservoir cells arranged in a set of layers in a vertical dimension of the three dimensional grid, the computer implemented method comprising the steps of:
   selecting a layer from the set of layers in the three dimensional grid;
   batch compressing the reservoir simulation grid data of the selected layer to a compressed layer file representation by performing the steps of:

subdividing the selected layer into a plurality of adjacent domains; and
defining a selected one of the adjacent plurality of domains of the selected layer as a two dimensional surface defined by corner points of juncture with adjacent domains and boundary tangent vectors of the surface at the corner points of juncture with adjacent domains;
storing in memory the compressed layer file representation of the selected layer;
repeating the steps of selecting, batch compressing and storing for each of the set of layers of the three dimensional grid; and
forming a reduced representation of the reservoir from the stored compressed layer file representations of the layers of the three dimensional grid for analysis.

2. The computer implemented process of claim 1, wherein the step of batch compressing comprises the steps of:
determining if each of the plurality of domains of the selected layer have been processed by the step of defining, and
if so, forming a layer temporal file for storage; and
if not, returning to the step of selecting.

3. A data processing system for compressing reservoir simulation data for reduced data storage requirements, the reservoir simulation data being representative of a subterranean reservoir organized into a three dimensional grid of reservoir cells arranged in a set of layers in a vertical dimension of the three dimensional grid, the data processing system comprising:
a processor performing the steps of:
(1) selecting a layer from the set of layers in the three dimensional grid; and
(2) batch compressing the reservoir simulation grid data to a compressed layer file representation by performing the steps of:
subdividing the selected layer into a plurality of adjacent domains; and
defining a selected one of the adjacent plurality of domains of the selected layer as a two dimensional surface defined by corner points of juncture with adjacent domains and boundary tangent vectors of the surface at the corner points of juncture with adjacent domains;
a memory storing the compressed layer file representation of the selected layer;
the processor further repeating the steps of selecting, batch compressing and storing for each of the set of layers of the three dimensional grid; and
an interface forming a reduced representation of the reservoir from the stored compressed layer file representations of the layers of the three dimensional grid for analysis.

4. The data processing system of claim 3, wherein the processor in performing of batch compressing performs the steps of:
determining if each of the plurality of domains of the selected layer have been processed by the step of defining, and
if so, forming a layer temporal file for storage; and
if not, returning to the step of selecting.

5. A data storage device having stored in a non-transitory computer readable medium computer operable instructions for causing a data processing system to compress reservoir simulation data for reduced data storage requirements, the reservoir simulation data being representative of a subterranean reservoir organized into a three dimensional grid of reservoir cells arranged in a set of layers in a vertical dimension of the three dimensional grid, the instructions stored in the data storage device causing the data processing system to perform the following steps:
selecting a layer from the set of layers in the three dimensional grid;
batch compressing the reservoir simulation grid data to a compressed layer file representation by performing the steps of:
subdividing the selected layer into a plurality of adjacent domains; and
defining a selected one of the adjacent plurality of domains of the selected layer as a two dimensional surface defined by corner points of juncture with adjacent domains and boundary tangent vectors of the surface at the corner points of juncture with adjacent domains;
storing in memory the compressed layer file representation of the selected layer;
repeating the steps of selecting, batch compressing and storing for each of the set of layers of the three dimensional grid; and
forming a reduced representation of the reservoir from the stored compressed layer file representations of the layers of the three dimensional grid for analysis.

6. The data storage device of claim 5, wherein the instructions cause the data processing system during batch processing to perform the steps of:
determining if each of the plurality of domains of the selected layer have been processed by the step of defining, and
if so, forming a layer temporal file for storage; and
if not, returning to the step of selecting.

7. A computer implemented method of decompressing reservoir simulation data from batch compressed form stored in memory of a computer, the reservoir simulation data being representative of a subterranean reservoir organized into a three dimensional grid of reservoir cells arranged in a set of individual layers in a vertical dimension of the three dimensional grid as a compressed grid reservoir file, with each layer divided into a plurality of adjacent domains; each adjacent domain being represented as a two dimensional surface defined by corner points of juncture with adjacent domains and boundary tangent vectors of the surface at the corner points of juncture with adjacent domains, the individual layers of the grid stored in memory of the computer in batch compressed form, the computer implemented method comprising the steps of:
retrieving the compressed grid reservoir file in batch compressed form from the computer memory;
selecting a layer in the batch compressed form from the retrieved compressed grid reservoir file;
obtaining for the selected layer the corner points of juncture with adjacent domains and boundary tangent vectors of the surface at the corner points of juncture with adjacent domains of the selected layer;
reconstructing the selected layer from the obtained corner points of juncture and boundary tangent vectors; and
forming an image of the reconstructed selected layer.

8. The computer implemented method of claim 7, further including the steps of:
determining if each of the set of individual layers has been processed; and
if so, forming a data set of the reconstructed layers of the reservoir simulation data for study and evaluation; and
if not, returning to the step of selecting a layer.

9. A data processing system for decompressing reservoir simulation data from batch compressed form stored in memory of a computer, the reservoir simulation data being representative of a subterranean reservoir organized into a three dimensional grid of reservoir cells arranged in a set of individual layers in a vertical dimension of the three dimensional grid as a compressed grid reservoir file, with each layer divided into a plurality of adjacent domains, each adjacent domain being represented as a two dimensional surface defined by corner points of juncture with adjacent domains and boundary tangent vectors of the surface at the corner points of juncture with adjacent domains, the individual layers of the grid stored in memory of the computer in batch compressed form, the data processing system comprising:
 a processor performing the steps of:
  retrieving the compressed grid reservoir file in batch compressed form from the computer memory;
  selecting a layer in batch compressed form from the retrieved compressed grid reservoir file;
  obtaining for the selected layer the corner points of juncture with adjacent domains and boundary tangent vectors of the surface at the corner points of juncture with adjacent domains of the selected layer;
  reconstructing the selected layer from the obtained corner points of juncture and boundary tangent vectors; and
  generating geometric data for forming an image of the selected layer;
 a display forming an image of the reconstructed selected layer.

10. The data processing system of claim 9, wherein the processor further performs the steps of:
 determining if each of the set of individual layers has been processed; and
 if so, forming a data set of the reconstructed layers of the reservoir simulation data for study and evaluation; and
 if not, returning to the step of selecting a layer.

11. A data storage device having stored in a non-transitory computer readable medium computer operable instructions for causing a data processing system to decompress reservoir simulation data from batch compressed form stored in memory of a computer, the reservoir simulation data being representative of a subterranean reservoir organized into a three dimensional grid of reservoir cells arranged in a set of individual layers in a vertical dimension of the three dimensional grid as a compressed grid reservoir file, with each layer divided into a plurality of adjacent domains, each adjacent domain being represented as a two dimensional surface defined by corner points of juncture with adjacent domains and boundary tangent vectors of the surface at the corner points of juncture with adjacent domains for the individual layers of the grid stored in memory of the computer in batch compressed form, the instructions stored in the data storage device causing the data processing system to perform the following steps:
 retrieving the compressed grid reservoir file in batch compressed form from the computer memory;
 selecting a layer in batch compressed form from the retrieved compressed grid reservoir file;
 obtaining for the selected layer the corner points of juncture with adjacent domains and boundary tangent vectors of the surface at the corner points of juncture with adjacent domains of the selected layer;
 reconstructing the selected layer form the obtained corner points of juncture and boundary tangent vectors; and
 forming an image of the reconstructed selected layer.

12. The data storage device of claim 11, wherein the instructions cause the data processing system during batch processing to perform the steps of:
 determining if each of the set of individual layers has been processed; and
 if so, forming a data set of the reconstructed layers of the reservoir grid simulation data for study and evaluation; and
 if not, returning to the step of selecting a layer.

13. A computer implemented method of providing visual images of reservoir simulation data representative of a subterranean reservoir organized into a three dimensional grid of reservoir cells arranged in a set of layers in a vertical dimension of the three dimensional grid, the reservoir simulation data being stored in batch compressed form as a compressed grid reservoir file with each layer divided into a plurality of adjacent domains, each adjacent domain being represented as a two dimensional surface defined by defined by corner points of juncture with adjacent domains and boundary tangent vectors of the surface at the corner points of juncture with adjacent domains, the individual layers of the grid stored in memory of the computer in batch compressed form, the computer implemented method comprising the steps of:
 decompressing the batch compressed reservoir simulation data based on the corner points of juncture and boundary tangent vectors stored of domains for the individual layers of the grid into geometric data;
 loading the geometric data for the layers resulting from the step of decompressing;
 mapping a scalar field of interest from the geometric data for the layers for surface reconstruction; and
 forming a display of the layers of the reservoir grid.

14. A data processing system providing images of compressed reservoir simulation data representative of a subterranean reservoir organized into a three dimensional grid of reservoir cells arranged in a set of layers in a vertical dimension of the three dimensional grid, the reservoir simulation data being stored in batch compressed form as a compressed grid reservoir file, with each layer divided into a plurality of adjacent domains, each adjacent domain being represented by two dimensional surface data defined by corner points of juncture with adjacent domains and boundary tangent vectors of the surface at the corner points of juncture with adjacent domains, the individual layers of the grid stored in memory, the data processing system comprising:
 a memory storing the batch compressed reservoir simulation data;
 a processor performing the steps of:
  decompressing the batch compressed reservoir simulation data based on corner points of juncture and boundary tangent vectors for the individual layers of the grid into geometric data;
  loading the geometric data for the layers resulting from the step of decompressing;
  mapping a scalar field of interest from the geometric data for the layers for surface reconstruction; and
 a display forming reconstructed surface images of the layers of the reservoir grid.

15. A data storage device having stored in a non-transitory computer readable medium computer operable instructions for causing a data processing system to provide images of batch compressed reservoir simulation data representative of a subterranean reservoir organized into a three dimensional grid of reservoir cells arranged in a set of layers in a vertical dimension of the three dimensional grid as a compressed grid reservoir file, with each layer divided into a plurality of adjacent domains, each adjacent domain being represented as a two dimensional surface defined by corner points of juncture with adjacent domains and boundary tangent vectors of the surface at the corner points of juncture with adjacent domains, the individual layers of the grid stored in memory, the instructions stored in the data storage device causing the data processing system to perform the following steps:

decompressing the batch compressed data based on the corner points of juncture and boundary tangent vectors stored of domains for the layers of the grid into geometric data;

loading the geometric data for the layers resulting from the step of decompressing;

mapping a scalar field of interest from the geometric data for the layers for surface reconstruction; and forming a display of the layers of the reservoir grid.

\* \* \* \* \*